(12) United States Patent
Kanno (10) Patent No.: US 6,620,334 B2
(45) Date of Patent: Sep. 16, 2003

(54) ETCHING APPARATUS AND ETCHING METHOD

(75) Inventor: Masahiro Kanno, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/106,369

(22) Filed: Mar. 27, 2002

(65) Prior Publication Data
US 2002/0142615 A1 Oct. 3, 2002

(30) Foreign Application Priority Data
Mar. 28, 2001 (JP) .................................. 2001-093742

(51) Int. Cl.$^7$ ................................................ B44C 1/22
(52) U.S. Cl. ................................................ 216/67; 216/71
(58) Field of Search ............... 156/345.44, 345.46, 156/345.47; 118/723 E; 216/67, 71; 204/298.37, 298.16

(56) References Cited

U.S. PATENT DOCUMENTS

| | | | | |
|---|---|---|---|---|
| 4,576,700 A | * | 3/1986 | Kadokura et al. | 204/192 M |
| 4,624,767 A | * | 11/1986 | Obinata | 204/298 |
| 5,397,956 A | | 3/1995 | Araki et al. | |
| 5,880,034 A | * | 3/1999 | Keller | 438/732 |
| 6,074,518 A | * | 6/2000 | Imafuku et al. | 156/345 |
| 6,458,253 B2 | * | 10/2002 | Ando et al. | 204/192.15 |

FOREIGN PATENT DOCUMENTS

JP      6-37054      2/1994

* cited by examiner

*Primary Examiner*—George Goudreau
(74) *Attorney, Agent, or Firm*—Oblon, Spivak, McClelland, Maier & Neustadt, P.C.

(57) ABSTRACT

An etching apparatus has (a) a processing unit to ionize a reactive gas and generate plasma to process a semiconductor wafer, (b) a bed on which the semiconductor wafer is set, (c) a first magnet arranged below the semiconductor wafer in the vicinity of the periphery of a semiconductor chip forming area defined on the semiconductor wafer, and (d) a second magnet arranged above the semiconductor wafer in the vicinity of the periphery of the semiconductor chip forming area.

9 Claims, 12 Drawing Sheets

ETCHING APPARATUS AND ETCHING METHOD

CROSS REFERENCE TO RELATED APPLICATIONS

This application is based upon and claims the benefit of priority from the prior Japanese Patent Application No. 2001-093742 filed on Mar. 28, 2001, the entire contents of which are incorporated herein by reference.

BACKGROUND OF THE INVENTION

1. Field of the Invention

The present invention relates to an etching apparatus and etching method for etching a semiconductor wafer with plasma.

2. Description of the Related Art

Etching a semiconductor wafer with plasma is carried out by forming a photoresist on the wafer and generating plasma to etch off part of the wafer surface not covered with the photoresist. Recent semiconductor wafers are increasing their diameters from 200 mm to 300 mm, making it difficult to evenly etch the whole surface of a large-diameter wafer.

Uneven etching on a semiconductor wafer badly affects processes carried out later on the wafer. For example, uneven etching on a wafer fluctuates the electric characteristics and dimensions of chips formed from the wafer. A technique of evenly etching a large-diameter wafer is needed.

SUMMARY OF THE INVENTION

According to an aspect of the present invention, an etching apparatus includes (a) a processing unit to ionize a reactive gas and generate plasma to process a semiconductor wafer, (b) a bed on which the semiconductor wafer is set, (c) a first magnet arranged below the semiconductor wafer in the vicinity of the periphery of a semiconductor chip forming area defined on the semiconductor wafer, and (d) a second magnet arranged above the semiconductor wafer in the vicinity of the periphery of the semiconductor chip forming area.

DETAILED DESCRIPTION OF EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

An etching apparatus according to the first embodiment of the present invention will be explained. The first embodiment generates a cylindrical magnetic field around a semiconductor wafer and confines plasma in the magnetic field.

Figure 1:
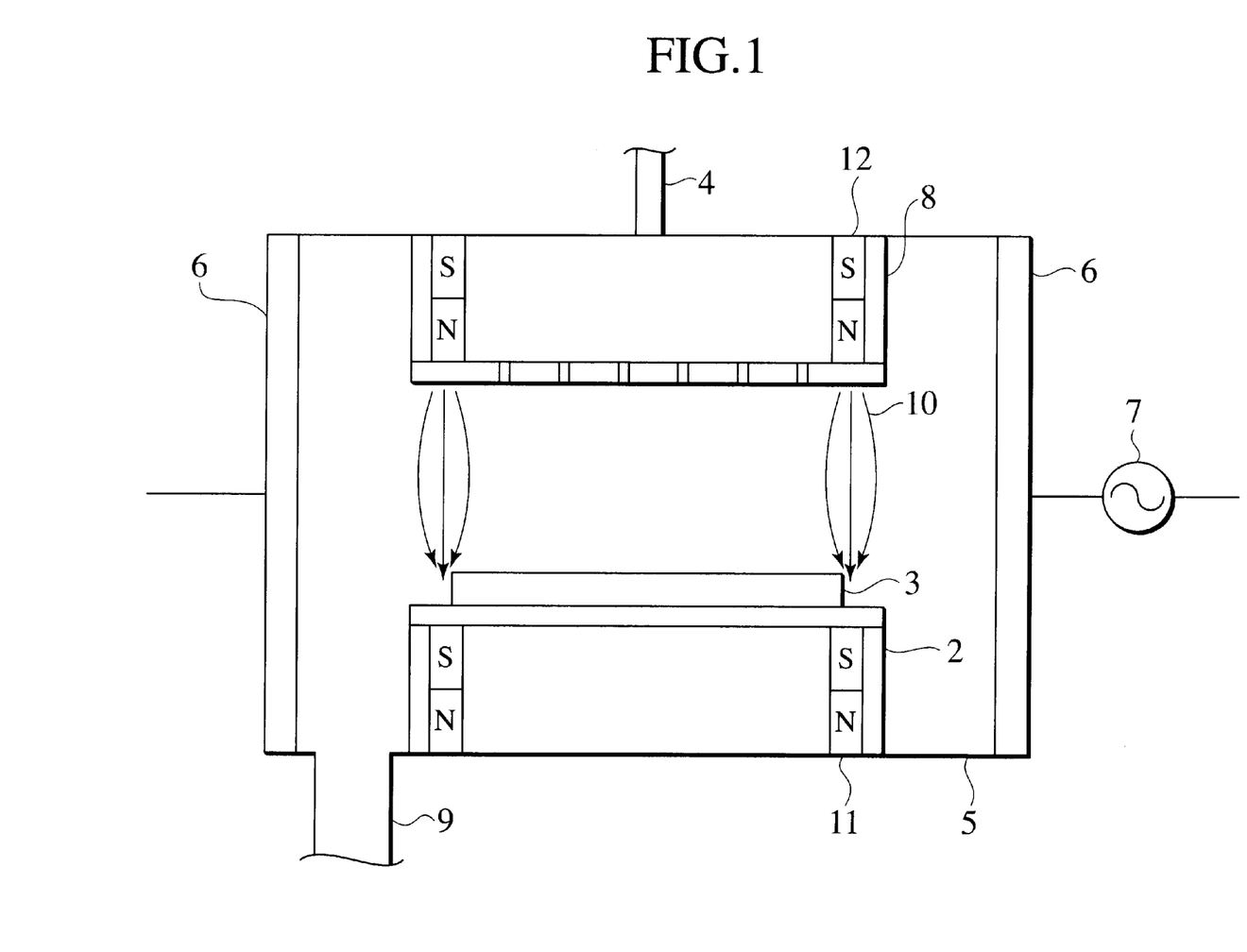
FIG. 1 is a sectional view roughly showing an etching apparatus according to a first embodiment of the present invention.

FIG. 1 shows the etching apparatus according to the first embodiment. The etching apparatus has (a) a processing unit employing electrodes 6 and a high-frequency power source 7 to ionize a reactive gas and generate plasma to process a semiconductor wafer 3, (b) a bed 2 on which the wafer 3 is set, (c) a first magnet 11 arranged below the wafer 3 in the vicinity of the periphery of a semiconductor chip forming area defined on the wafer 3, and (d) a second magnet 12 arranged above the wafer 3 in the vicinity of the periphery of the semiconductor chip forming area. The etching apparatus also has a reactive gas inlet pipe 4, a chamber 5, and an outlet pipe 9.

The chamber 5 is evacuated through the outlet pipe 9, a reactive gas is introduced into the chamber 5 through the inlet pipe 4, and the power source 7 applies a voltage to the electrodes 6 to ionize the reactive gas and generate plasma.

The bed 2 is arranged at the bottom center of the changer 5, and the wafer 3 is set on the bed 2.

The magnets 11 and 12 are both cylindrical. The magnet 11 is installed under the bed 2. The magnet 12 is installed above the wafer 3 and is covered with a protector 8. The bed 2 and protector 8 do not affect a magnetic field 10 generated by the magnets 11 and 12.

Figure 2:
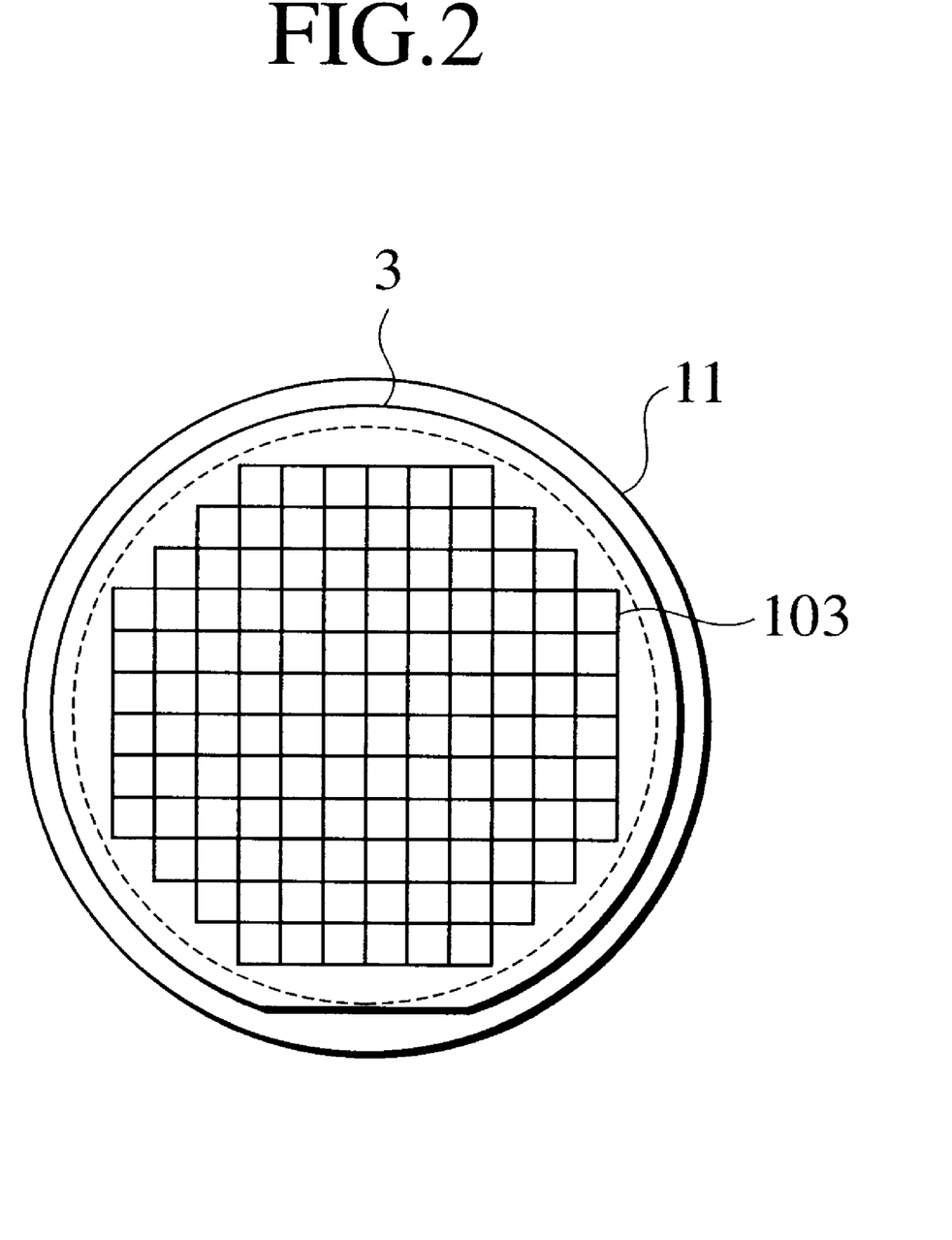
FIG. 2 is a plan view showing a positional relationship between a semiconductor wafer 3 and a magnet 11 in the apparatus of FIG. 1.

FIG. 2 is a plan view showing a positional relationship between the wafer 3 and the magnet 11. The outer diameter of the magnet 11 is slightly greater than the diameter of the wafer 3. The inner diameter of the magnet 11 indicated by a dotted line is slightly greater than the diameter of the chip forming area of the wafer 3 where semiconductor chips 103 are formed. All of the chips 103 to be formed on the wafer 3 are within the inner diameter of the magnet 11. The center of the wafer 3 is set substantially at the center of the magnet 11. The inner and outer diameters of the magnet 12 are substantially equal to those of the magnet 11. The center of the magnet 12 is set substantially at the center of the magnet 11. The magnets 11 and 12 are arranged in the vicinity of the periphery of the chip forming area of the wafer 3. This means that the inner circumference of each of the magnets 11 and 12 is slightly outside the periphery of the chip forming area of the wafer 3. More precisely, (a) as shown in FIG. 2, the inner circumference of the magnet 11 is close to the periphery of the chip forming area of the wafer 3, and (b) as shown in FIG. 1, the magnet 11 is spaced from the bottom of the wafer 3 by the thickness of the bed 2 and the magnet 12 is spaced from the top of the wafer 3 by the height of a space where the magnetic field 10 is generated plus the thickness of the protector 8.

In FIG. 1, the magnet 11 has an S-pole on the wafer side, and the magnet 12 has an N-pole on the wafer side. Alternatively, the magnet 11 may have an N-pole on the wafer side and the magnet 12 may have an S-pole on the wafer side.

According to the first embodiment, the magnet 11 is arranged below the wafer 3 in the vicinity of the periphery of the chip forming area where the semiconductor chips 103 are formed. At the same time, the magnet 12 is arranged above the wafer 3 in the vicinity of the periphery of the chip forming area. The magnets 11 and 12 generate the magnetic field 10 along and above the periphery of the chip forming area. The chamber 5 is evacuated, and a reactive gas is introduced through the inlet pipe 4 into a space surrounded by the magnetic filed 10. The power source 7 applies a high-frequency voltage to the reactive gas, which is ionized to generate plasma. The plasma etches the chip forming area of the wafer 3 where the semiconductor chips 103 are formed.

Plasma, in nature, is repelled by a strong magnetic field toward a weak magnetic field. Accordingly, the plasma surrounded by the cylindrical magnetic field 10 between the magnets 11 and 12 is unable to escape to the outside of the magnetic field 10.

According to the first embodiment, the plasma is evenly distributed in the space surrounded by the cylindrical magnetic field 10 without dispersing into the chamber 5, to uniformly etch the chip forming area of the wafer 3.

The strength of the magnetic field 10 is determined according to the diameter of a wafer to be etched and the type of a reactive gas to use. If the wafer diameter is 200 mm and the reactive gas is a chlorine gas, the strength of the magnetic field 10 generated by the magnets 11 and 12 is preferably about 200 gausses.

The magnets 11 and 12 may be permanent magnets or electromagnets. If they are electromagnets, a power source (not shown) to supply power to the electromagnets is needed.

The shapes of the magnets 11 and 12 are not limited to those mentioned above. The magnets 11 and 12 may have shapes selected from a group including a ring, a cylinder, and a polygonal pipe. One or both of the magnets 11 and 12 may be divided into sections, or may have cuts.

Figure 3A:
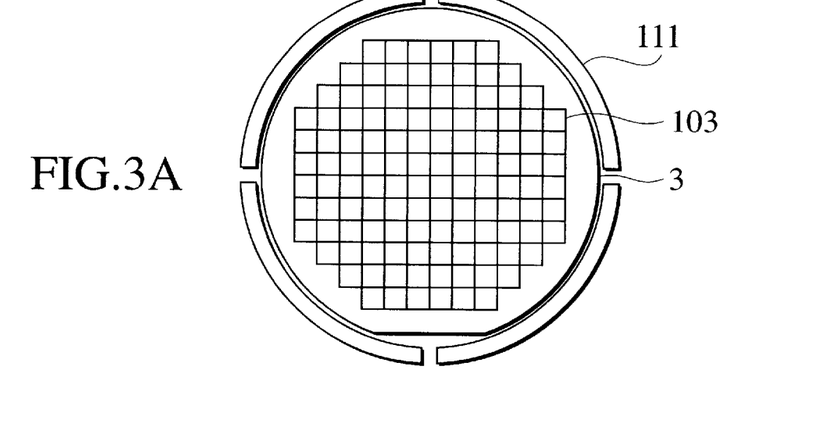
FIGS. 3A to 3C are plan views showing magnets applicable to the apparatus of FIG. 1.

FIG. 3A shows four magnets 111 usable as the magnets 11 or 12 in the etching apparatus of FIG. 1. The magnets 111 have each a circular arc shape and are arranged so as to surround the wafer 3. Although there is a space between the adjacent magnets 111, the four magnets 111 are capable of generating a cylindrical magnetic field surrounding a space on the wafer 3.

Figure 3B:
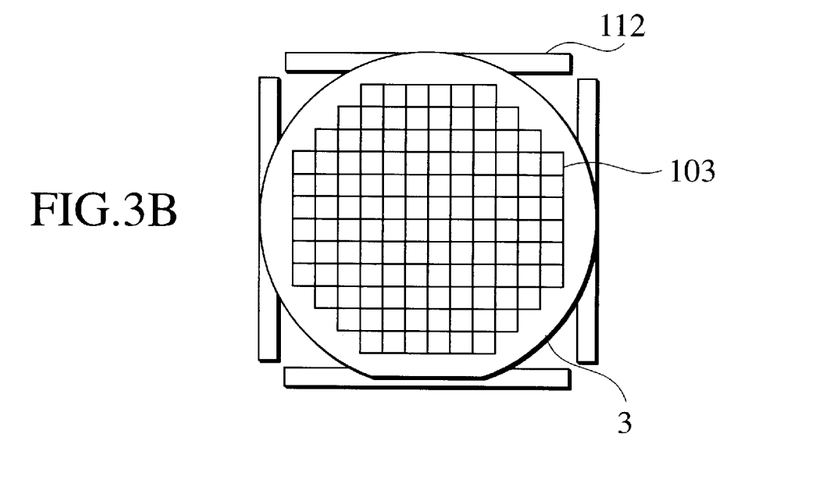

FIG. 3B shows four magnets 112 usable as the magnets 11 or 12 in the etching apparatus of FIG. 1. The magnets 112 are linear and arranged to surround the wafer 3. The four magnets 112 generate a quadrangle-pipe magnetic field that sufficiently confines plasma therein.

Figure 3C:
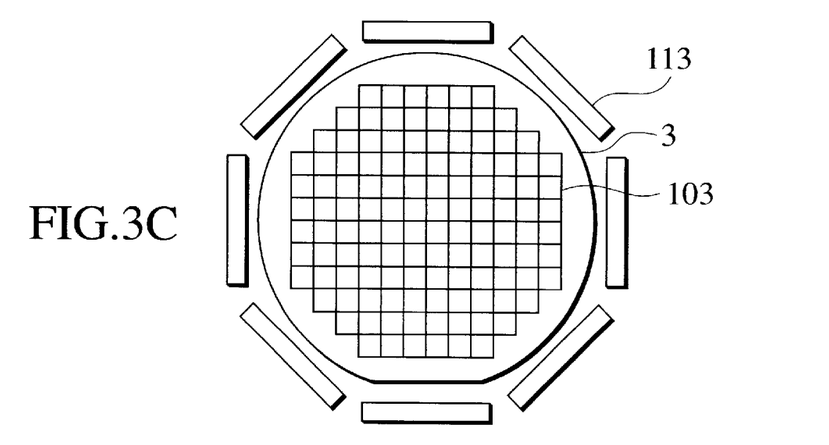

FIG. 3C shows eight magnets 113 usable as the magnets 11 or 12 in the etching apparatus of FIG. 1. The magnets 113 are linear and short and are arranged to surround the wafer 3. The eight magnets 113 generate an octagonal-pipe magnetic field that sufficiently confines plasma therein and uniformly etches the chip forming area of the wafer 3.

An inner circumference defined by the four magnets 111 of FIG. 3A is greater than the circumference of the wafer 3.

This inner circumference may be smaller than the circumference of the wafer 3 as in the magnet 11 of FIG. 2. In this case, the chip forming area of the wafer 3 must be inside the inner circumference of the magnets 111. As shown in FIG. 3B, the linear magnets may partly come under the wafer 3. In this case, the chip forming area of the wafer 3 must be inside an inner quadrangle defined by the magnets 112.

The etching apparatus of FIG. 1 may employ a cylindrical magnet having a bottom. Also employable is a solid circular or polygonal column magnet. When employing such a solid magnet having no hollow, the magnet must have a magnetic shield facing the wafer 3. The magnetic shield must cover an area equal to or larger than the chip forming area of the wafer 3.

Figure 4A:
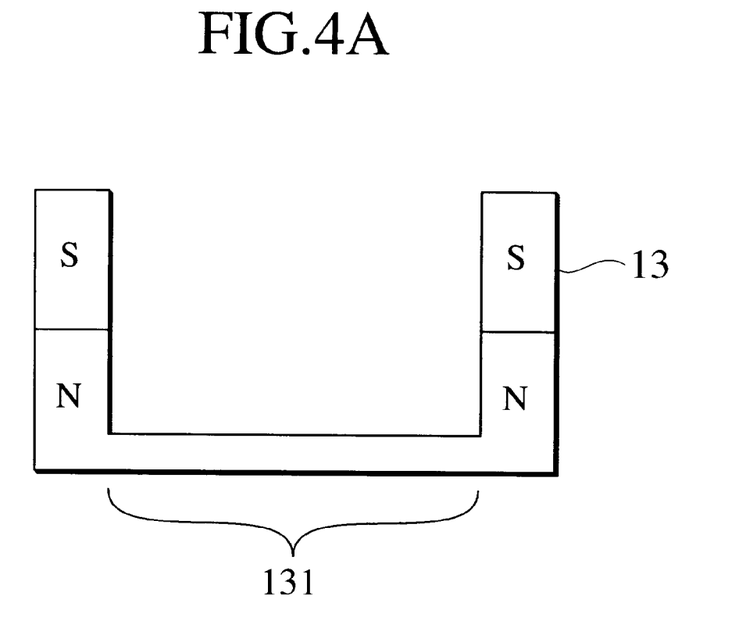
FIGS. 4A and 4B are sectional views showing magnets applicable to the apparatus of FIG. 1.
Figure 4B:
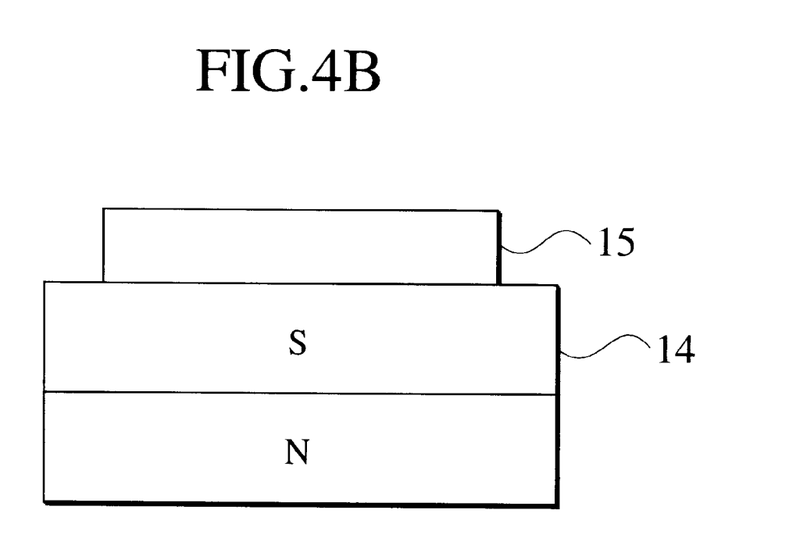

FIG. 4A shows a magnet 13 having a bottom 131, which is usable as the magnets 11 or 12 in the etching apparatus of FIG. 1. FIG. 4B shows a cylindrical solid magnet 14 having a magnetic shield 15, usable as the magnets 11 or 12 in the etching apparatus of FIG. 1. The magnetic shield 15 has a disk shape so that the magnet 14 may generate a cylindrical magnetic field. The magnet 14 and magnetic shield 15 may have each a quadrangle shape to generate a quadrangle-pipe magnetic field. One or both of the magnets 11 and 12 arranged below and above the wafer 3 may be replaced with the magnet 13 of FIG. 4A or the magnet 14 and magnetic shield 15 of FIG. 4B, to realize the effect of the first embodiment. The bottom 131 of FIG. 4A may have a magnetic shield.

(Second Embodiment)

An etching apparatus according to the second embodiment of the present invention will be explained. The second embodiment generates a quadrangle-pipe magnetic field to surround each semiconductor chip on a semiconductor wafer and confine plasma therein.

Figure 5:
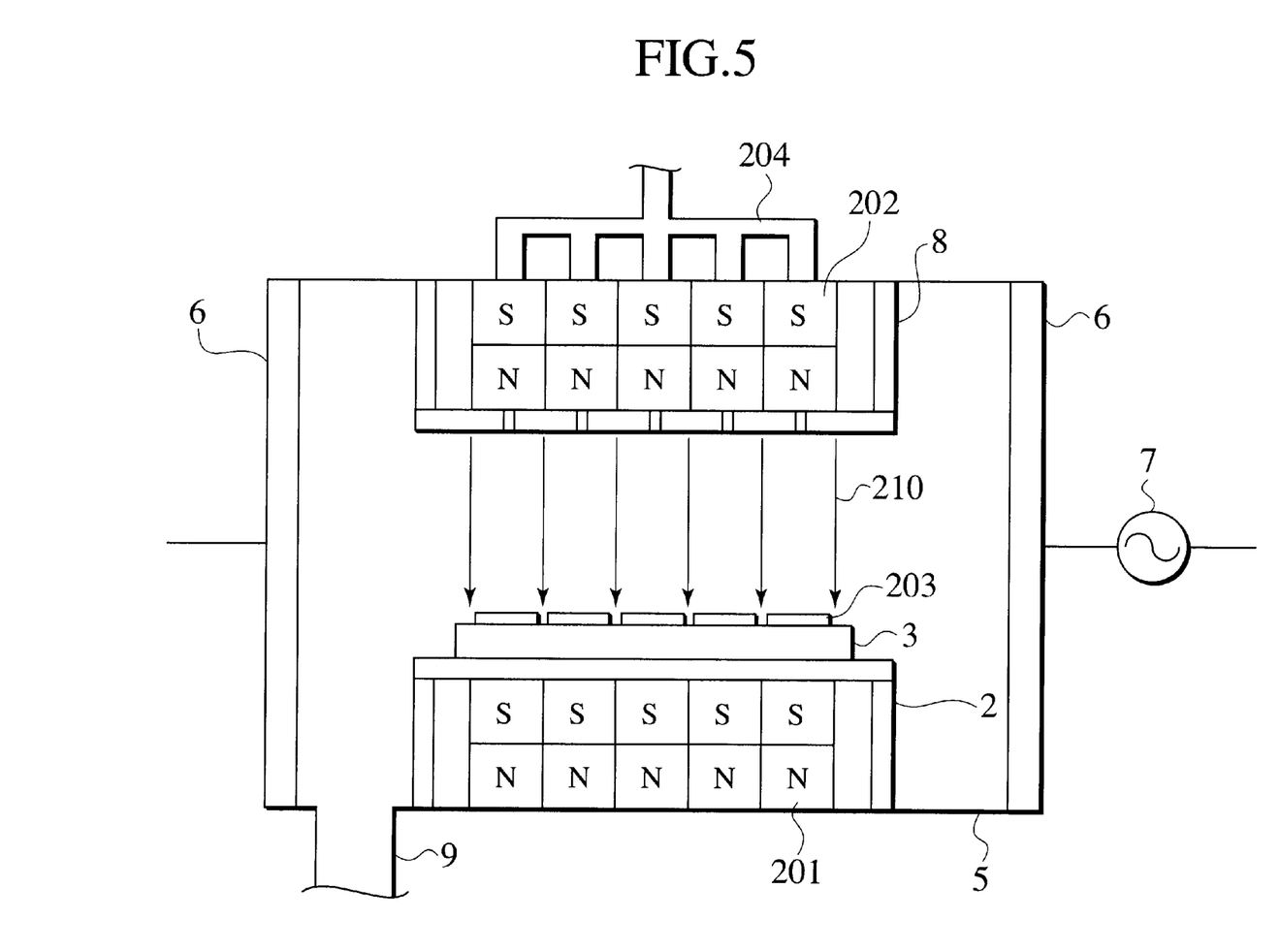
FIG. 5 is a sectional view roughly showing an etching apparatus according to a second embodiment of the present invention.
Figure 6:
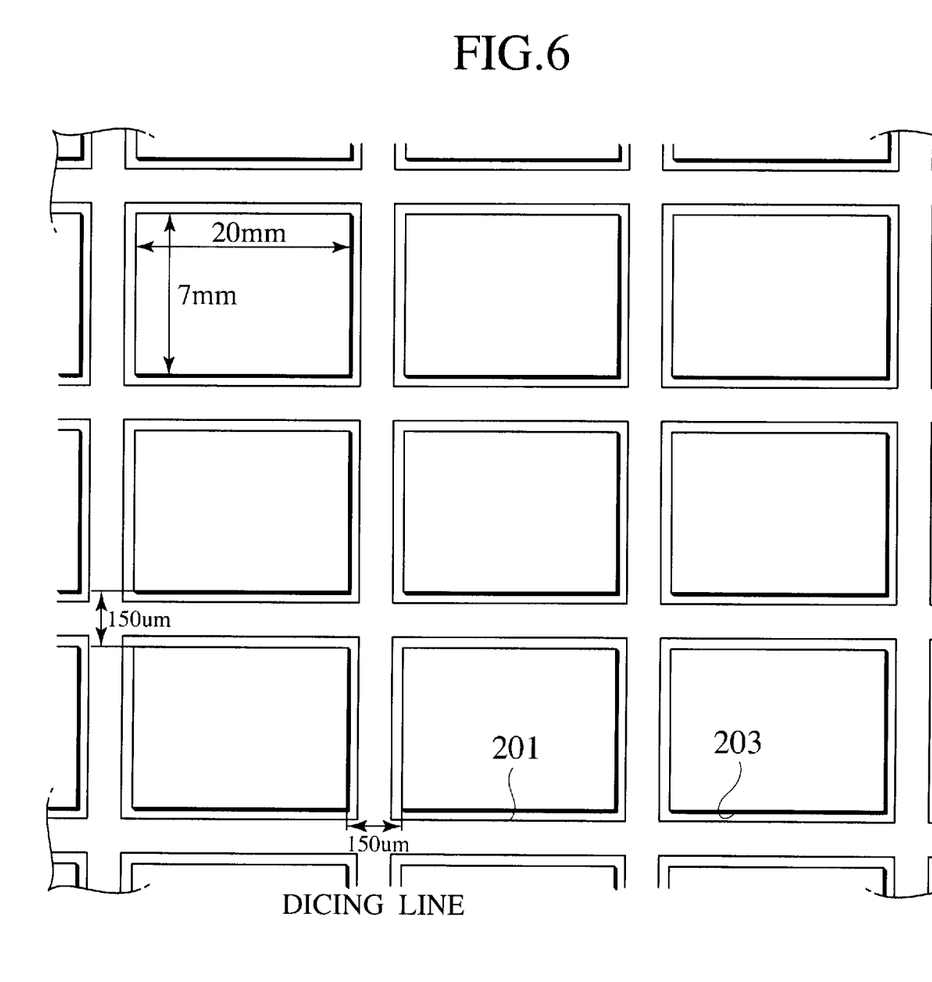
FIG. 6 is a plan view showing a positional relationship between semiconductor chips 203 and a magnet 201 in the apparatus of FIG. 5.

FIG. 5 shows the etching apparatus according to the second embodiment and FIG. 6 shows a positional relationship between a magnet 201 and semiconductor chips 203. The etching apparatus has the first magnet 201 and a second magnet 202. Each of the magnets 201 and 202 is a lattice. The positions of lattice points of the magnet 201 correspond to those of the magnet 202, respectively. Every four lattice points of the magnet 201 forms a quadrangle corresponding to one semiconductor chip 203 formed on a semiconductor wafer 3.

Like the etching apparatus of the first embodiment, the etching apparatus of the second embodiment has a chamber 5, a reactive gas inlet pipe 204, electrodes 6, a high-frequency power source 7, a protector 8, an outlet pipe 9, and a bed 2. The bed 2 is arranged at the bottom center of the chamber 5. The wafer 3 is set on the bed 2. The magnet 201 is arranged under the bed 2. The magnet 202 is arranged above the wafer 3 and is covered with the protector 8. The bed 2 and protector 8 do not affect a magnetic field 210 generated by the magnets 201 and 202. The chamber 5 is evacuated through the outlet pipe 9, and a reactive gas is introduced into the chamber 5 through the inlet pipe 204. The power source 7 applies a voltage to the electrodes 6, to ionize the reactive gas and generate plasma.

The difference between the first and second embodiments is the shape of a magnetic field. According to the first embodiment, the magnets 11 and 12 generate a large single cylindrical magnetic field wholly surrounding the wafer 3 and a space on the wafer 3. On the other hand, the magnets 201 and 202 of the second embodiment generate a plurality of small quadrangle-pipe magnetic fields each surrounding one semiconductor chip 203 formed on the wafer 3 and a space on the chip 203.

The magnet 201 is a lattice as shown in FIG. 6. The magnet 202 is also a lattice. The positions of lattice points of the magnet 201 correspond to those of the magnet 202, respectively. Namely, each lattice point of the magnet 202 is positioned right above a corresponding lattice point of the magnet 201. Every four lattice points of the magnet 201 defines a quadrangle corresponding to a semiconductor chip 203. Namely, the center of each quadrangle defined by the four lattice points of the magnet 201 is substantially under the center of a semiconductor chip 203. The center of a quadrangle defined by the four lattice points of the magnet 202 is substantially at the center of a semiconductor chip 203.

Each magnetic field 210 generated by the magnets 201 and 202 has a small quadrangle-pipe shape surrounding a corresponding semiconductor chip 203 and a space on the chip 203. Plasma generated according to the first embodiment is confined in each quadrangle-pipe magnetic field 210 and is unable to escape outside of the magnetic field 210.

According to the second embodiment, plasma is uniformly distributed in each magnetic field 210 to evenly etch the corresponding chip 203.

The strength of each magnetic field 210 is determined according to the size of the chip 203, the width of a dicing line, and the type of the reactive gas. If the chip size is 7 mm by 20 mm, the dicing line width is 150 ? m, and the reactive gas is a chlorine gas, the strength of each magnetic field 210 generated by the magnets 201 and 202 is preferably about 200 gausses.

The magnets 201 and 202 may be permanent magnets or electromagnets. If they are electromagnets, a power source (not shown) to supply power to the electromagnets is needed.

(First Modification)

Figure 7:
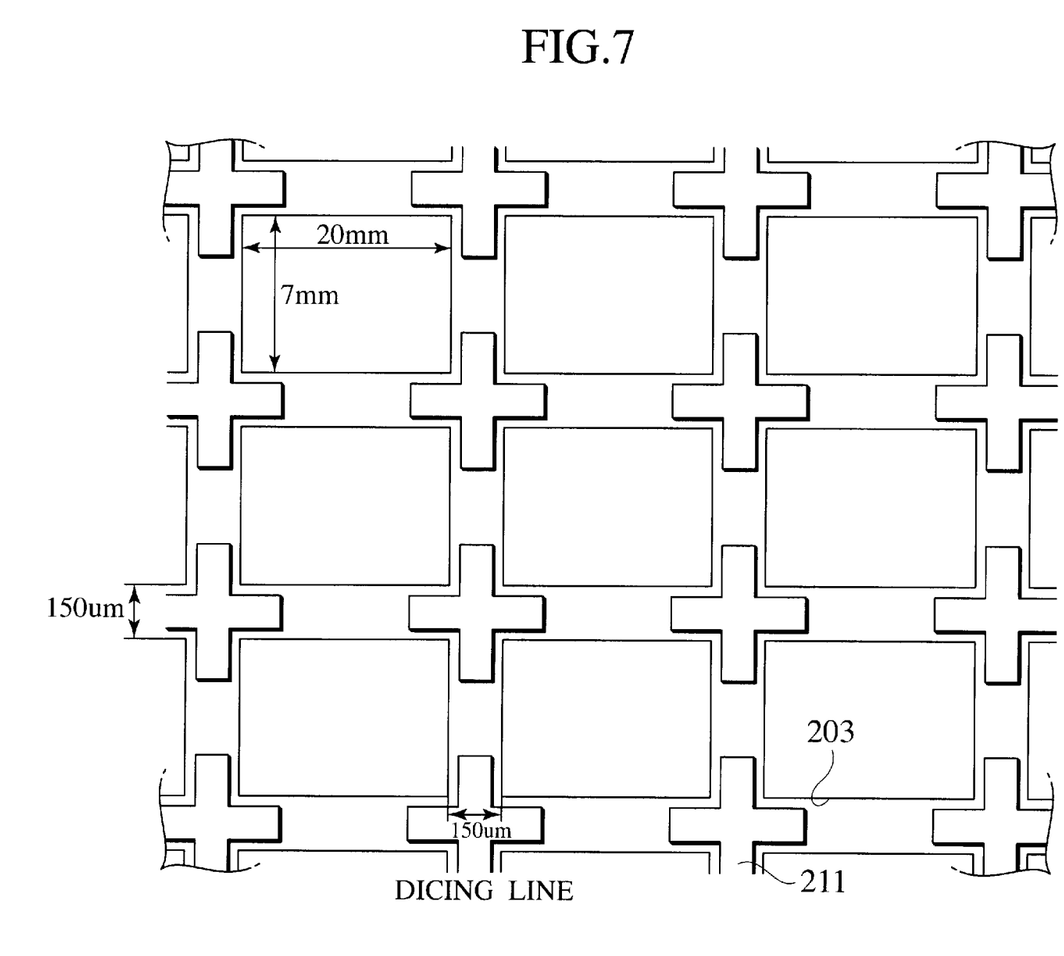
FIGS. 7 and 8 are plan and perspective views showing a magnet applicable to the apparatus of FIG. 5.
Figure 8:
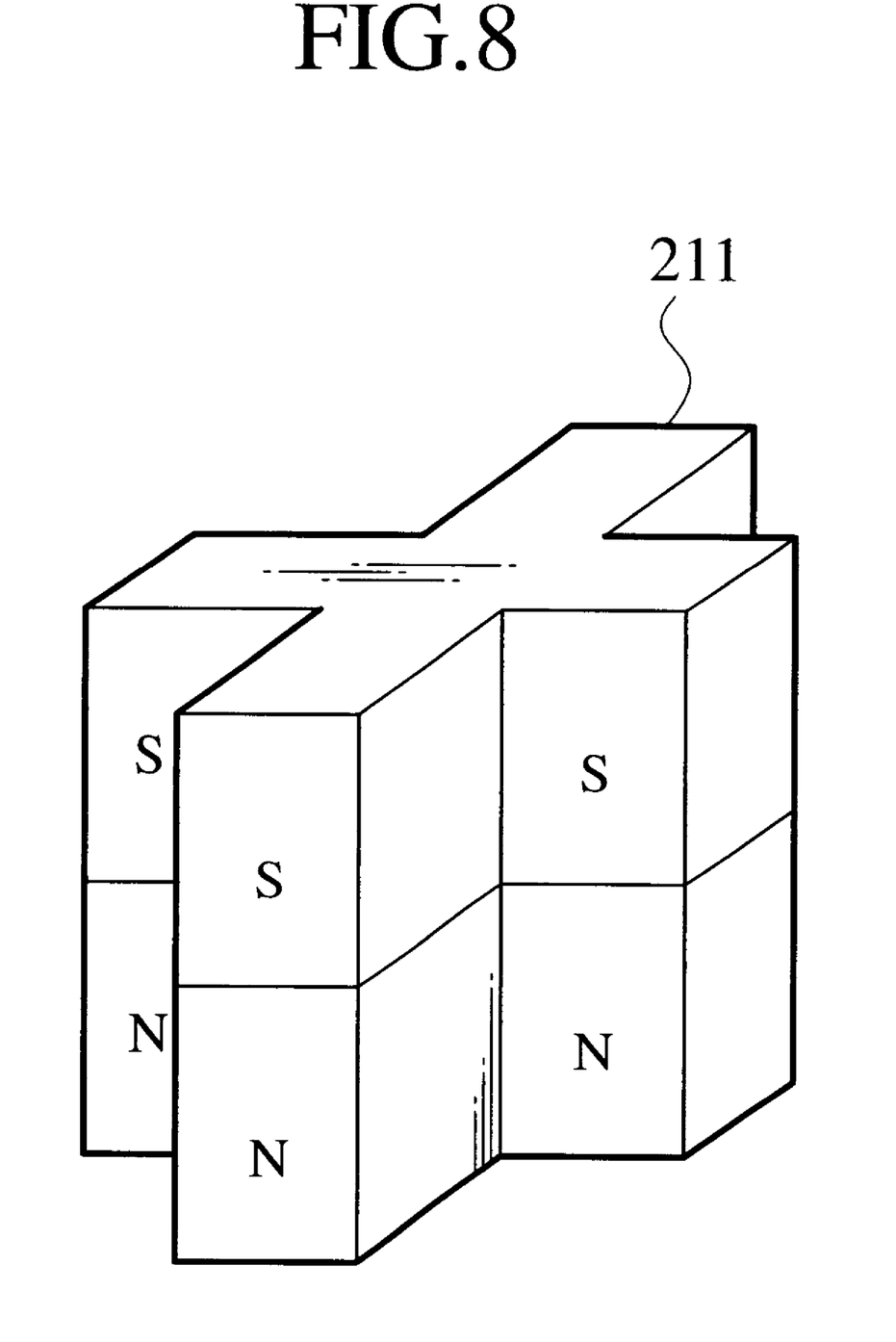

The shapes of the magnets of the second embodiment are not limited to those mentioned above. FIGS. 7 and 8 show magnets 211 according to a first modification of the second embodiment, applicable to the etching apparatus of FIG. 5. Each magnet 211 has a cross-shaped section. The magnets 211 are arranged at regular intervals so that each magnet 211 is positioned outside a corner of a semiconductor chip 203 formed on a semiconductor wafer. Magnets each having the same shape as the magnet 211 are arranged above the magnets 211 to face the magnets 211. These magnets generate columnar magnetic fields each having a cross-shaped section and being positioned outside a corner of a chip 203. The intervals of the magnetic fields are properly set to surround a space on each chip 203 and evenly distribute plasma in the chip space, thus uniformly etching the chip 203.

Even if the intervals of the magnetic fields are relatively wide, the magnetic fields repel plasma toward the chips 203 to uniformly etch the chips 203.

Figure 9:
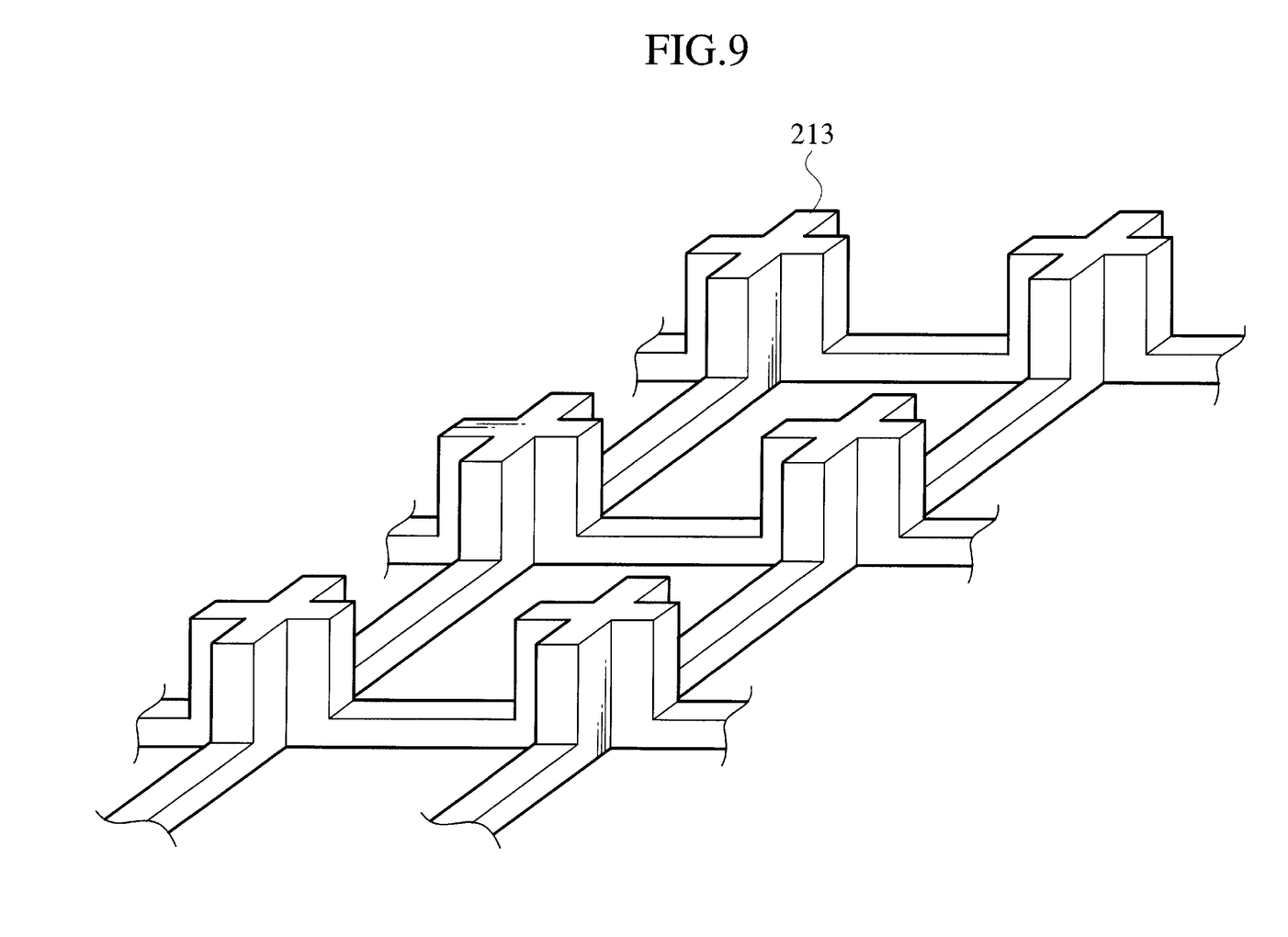
FIG. 9 is a perspective view showing joined magnets each being the magnet of FIG. 8.
Figure 10:
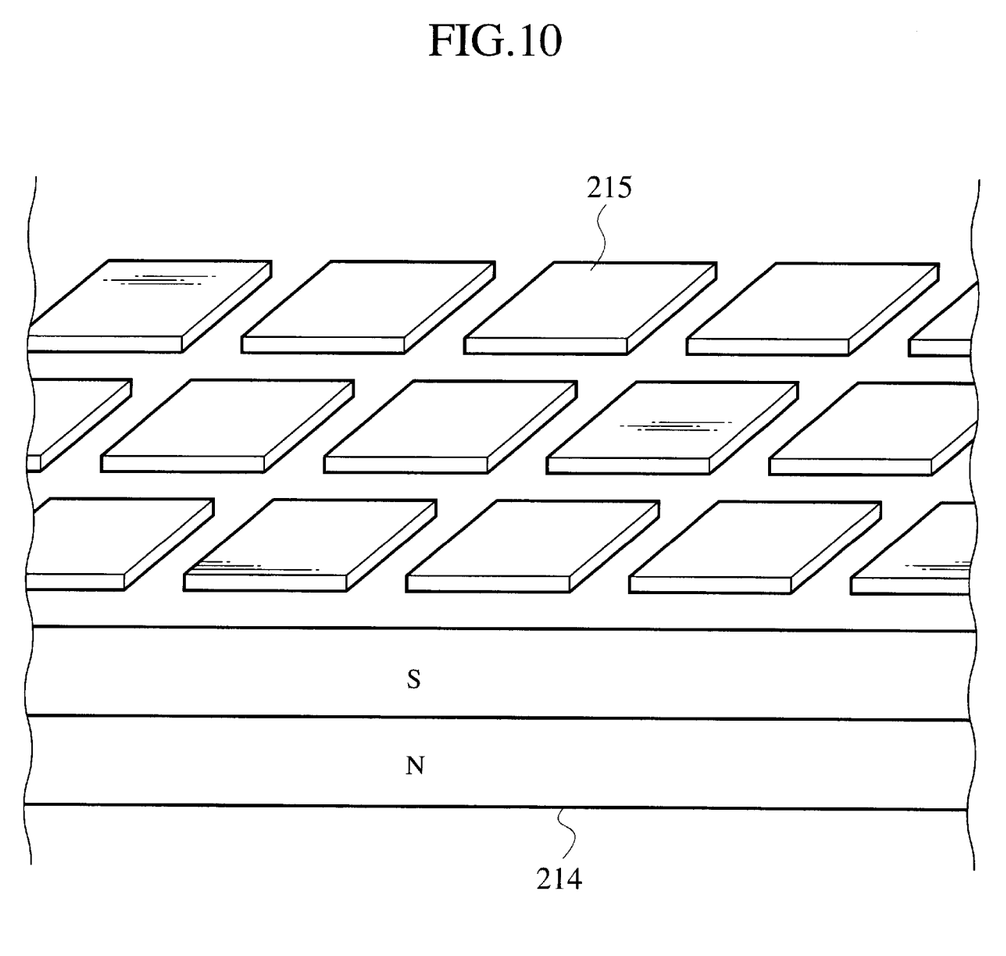
FIG. 10 is a perspective view showing a magnet applicable to the apparatus of FIG. 5.

FIG. 9 shows a magnet 213 that is formed by joining the magnets 211 of FIG. 8 in longitudinal and lateral directions. FIG. 10 shows a solid cylindrical magnet 214 provided with magnetic shields 215. Each magnetic shield 215 has substantially the same size as the chip 203 of FIG. 6, and the number of the magnetic shields 215 is equal to the number of the chips 203. The magnetic shields 215 are arranged under the chips 203, respectively. Both the magnets 213 and 214 of FIGS. 9 and 10 are applicable to the apparatus of FIG. 5.

One or both of the magnets 201 and 202 of FIG. 5 may be replaced with the magnets 211 of FIGS. 7 and 8, the magnet 213 of FIG. 9, or the magnet 214 and magnetic shields 215 of FIG. 10, to realize the effect of the second embodiment.

(Second Modification)

The second embodiment and first modification thereof place a single semiconductor chip in one quadrangle-pipe magnetic field. A second modification of the second embodiment places a plurality of semiconductor chips in one quadrangle-pipe magnetic field.

Figure 11:
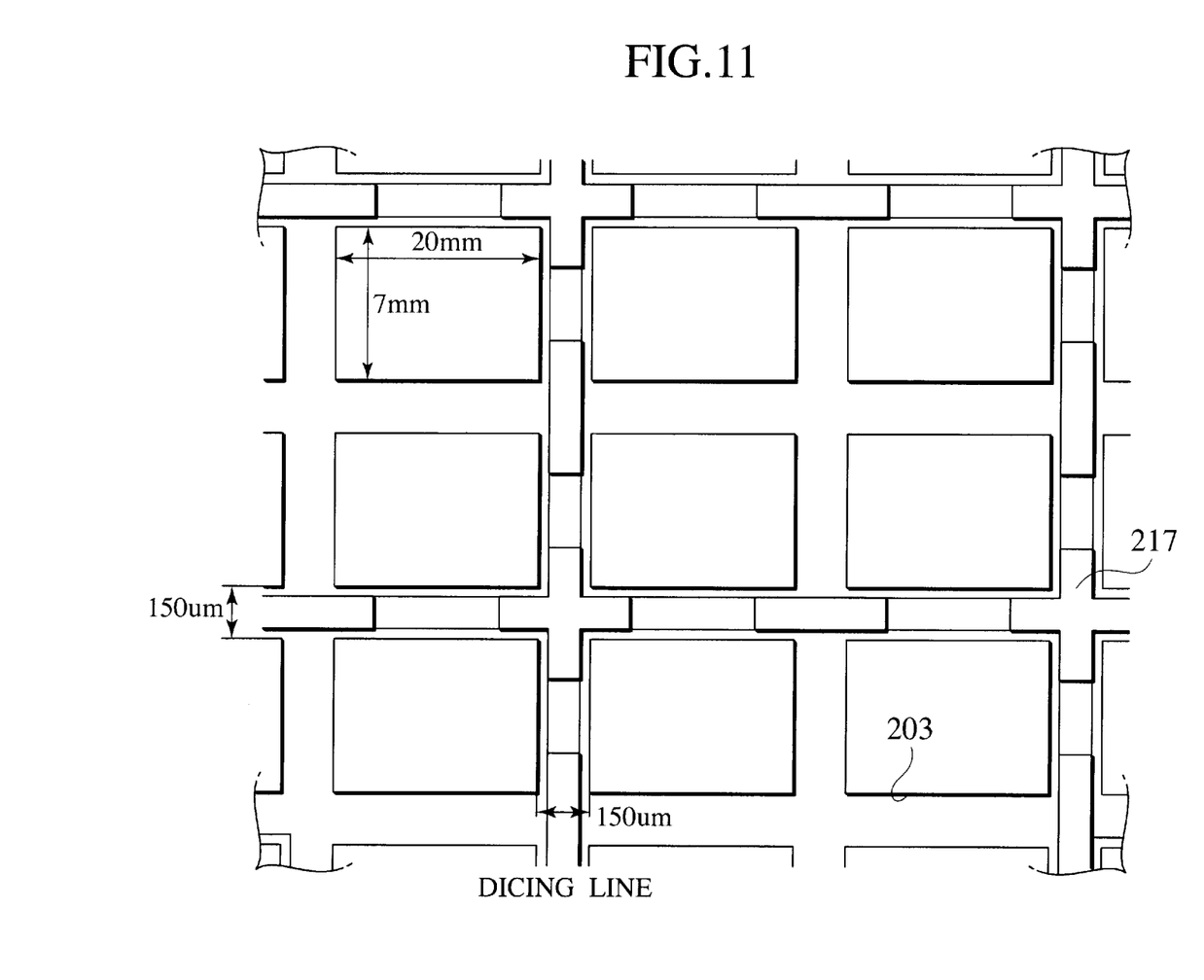
FIG. 11 is a plan view showing a positional relationship between semiconductor chips 203 and a magnet 217 according to a modification of the second embodiment.
Figure 12:
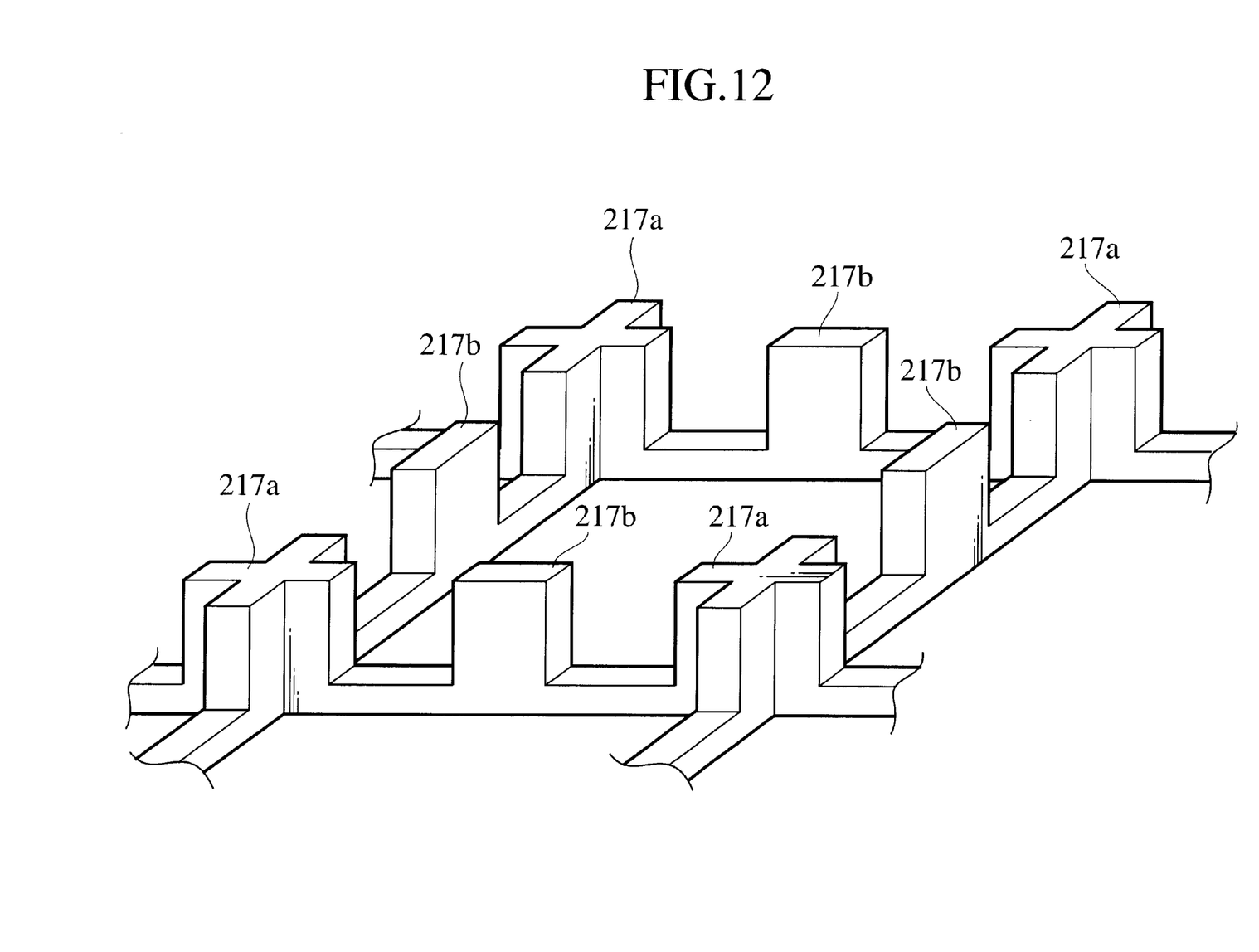
FIG. 12 is a perspective view showing the magnet 217 of FIG. 11.

FIGS. 11 and 12 show a magnet 217 according to the second modification of the second embodiment, applicable to the etching apparatus of FIG. 5. In FIG. 11, four semiconductor chips 203 are arranged in two rows and two columns to form a group. The magnet 217 generates a magnetic field to surround such a group of four chips 203.

The magnet 217 is a lattice like the magnet 213 of FIG. 9. In the magnet 213 of FIG. 9, two groups of parallel lines orthogonal to each other form a quadrangle to surround a single semiconductor chip 203. In the magnet 217 of FIGS. 11 and 12, two groups of parallel lines orthogonal to each other form a quadrangle surrounding four semiconductor chips 203.

In FIG. 12, the distance between adjacent lattice points 217a is substantially equal to twice a side length of the semiconductor chip 203. In this case, the strength of a magnetic field generated between the adjacent lattice points 217a may be insufficient to confine plasma therein. To solve this problem, the magnet 217 is provided with a projection 217b between adjacent lattice points 217a.

The magnet 217 shown in FIGS. 11 and 12 is paired with another one having the same structure. The two magnets 217 are arranged above and below the semiconductor wafer 3 instead of the magnets 201 and 202 in the etching apparatus of FIG. 5, to generate quadrangle-pipe magnetic fields to surround all of the four semiconductor chips 203 and spaces thereon.

In this way, the second modification is capable of uniformly etching semiconductor chips formed on a semiconductor wafer. The second modification generates magnetic fields each surrounding a group of semiconductor chips. Compared with the second embodiment and first modification thereof, the second modification requiring a magnet of a simpler structure, thus simplifying the structure of the etching apparatus.

As explained above, the etching apparatus according to any one of the embodiments and modifications of the present invention employs magnetic fields to control plasma concentration on a semiconductor wafer and uniformly etch semiconductor chip areas on the wafer.

Although the present invention has been explained in terms of various embodiments, it is not intended that the invention be limited to these embodiments. Modifications within the spirit of the invention will be apparent to those skilled in the art.

What is claimed is:

1. An etching method comprising:

arranging a first magnet which has a first periphery portion and a first lattice shape portion below a semiconductor wafer so that the first periphery portion is in the vicinity of the periphery of a semiconductor chip forming area defined on the semiconductor wafer;

arranging a second magnet which has a second periphery portion and a second lattice shape portion above the semiconductor wafer so that the second periphery portion is in the vicinity of the periphery of the semiconductor chip forming area and lattice points of the second lattice shape portion correspond to lattice points of the first lattice shape portion respectively;

generating a magnetic field in the vicinity of the periphery of the semiconductor chip forming area and in a space thereon between the first and second magnets;

introducing a reactive gas into a space surrounded by the magnetic field;

ionizing the reactive gas in the space, to generate plasma; and etching the semiconductor chip forming area with the plasma, wherein every four lattice points define a quadrangle corresponding to an area of the semiconductor wafer where at least one semiconductor chip is formed.

2. The method of claim 1, wherein:

the first and second magnets have each a lattice shape;

the first and second magnets are arranged so that the positions of lattice points of the first and second magnets correspond to each other; and together four lattice points of the first magnet define a quadrangle to contain an area of the semiconductor wafer where a semiconductor chip is formed.

3. The method of claim 2, wherein the number of semiconductor chips contained in the quadrangle is at least one.

4. The method of claim 1, wherein a polarity of the first magnet on the wafer side is opposite to a polarity of the second magnet on the wafer side.

5. The method of claim 1, wherein the first and second magnets are each selected from a group including an electromagnet and a permanent magnet.

6. The method of claim 1, wherein shapes of the first and second magnets are each selected from a group including a ring, a cylinder, and a polygonal pipe.

7. The method of claim 1, wherein at least one of the first and second magnets is divided into sections.

8. The method of claim 1, wherein at least one of the first and second magnets has cuts.

9. The method of claim 1, wherein at least one of the first and second magnets has at least one of a circular or polygonal shaped column and each are provided with a magnetic shield facing the semiconductor wafer, the magnetic shield having a plan shape substantially equal to a plan shape of the semiconductor chip forming area.

* * * * *